US010825789B1

(12) United States Patent
Van Gemert et al.

(10) Patent No.: US 10,825,789 B1
(45) Date of Patent: Nov. 3, 2020

(54) UNDERBUMP METALLIZATION DIMENSION VARIATION WITH IMPROVED RELIABILITY

(71) Applicant: NXP B.V., Eindhoven (NL)

(72) Inventors: Leo Van Gemert, Nijmegen (NL); Adrianus Buijsman, Nijmegen (NL); Jeroen Johannes Maria Zaal, Nijmegen (NL); Michiel Van Soestbergen, Wageningen (NL); Peter Joseph Hubert Drummen, Someren (NL)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 16/550,549

(22) Filed: Aug. 26, 2019

(51) Int. Cl.
*H01L 23/00* (2006.01)
(52) U.S. Cl.
CPC .............. *H01L 24/14* (2013.01); *H01L 24/05* (2013.01); *H01L 24/13* (2013.01); *H01L 2224/0401* (2013.01); *H01L 2224/05015* (2013.01); *H01L 2224/05024* (2013.01); *H01L 2224/05124* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05171* (2013.01); *H01L 2224/05184* (2013.01); *H01L 2224/13014* (2013.01); *H01L 2224/13026* (2013.01); *H01L 2224/1403* (2013.01); *H01L 2224/14132* (2013.01); *H01L 2924/351* (2013.01)

(58) Field of Classification Search
CPC ......... H01L 24/14; H01L 24/05; H01L 24/13; H01L 2224/0401; H01L 2224/05015; H01L 2224/05024; H01L 2224/05124; H01L 2224/05144; H01L 2224/05147; H01L 2224/05155; H01L 2224/05164; H01L 2224/05166; H01L 2224/05171; H01L 2224/05184; H01L 2224/13014; H01L 2224/1026; H01L 2224/1403; H01L 2224/14132; H01L 2924/351
USPC ........................................................ 257/738
See application file for complete search history.

(56) References Cited

U.S. PATENT DOCUMENTS

| 5,641,946 | A  | 6/1997 | Shim, II |
| 5,872,399 | A  | 2/1999 | Lee |
| 6,201,305 | B1 | 3/2001 | Darveaux et al. |
| 6,443,351 | B1 | 9/2002 | Huang et al. |
| 7,786,579 | B2 | 8/2010 | Audet et al. |

(Continued)

*Primary Examiner* — Tong-Ho Kim

(57) ABSTRACT

One embodiment of a packaged semiconductor device includes: a redistributed layer (RDL) structure formed over an active side of a semiconductor die embedded in mold compound, the RDL structure includes a plurality of solder ball pads that in turn includes: a set of first solder ball pads located on a front side of the packaged semiconductor device within a footprint of the semiconductor die, and a set of second solder ball pads located on the front side of the packaged semiconductor device outside of the footprint of the semiconductor die, each first solder ball pad includes a first center portion having a first diameter measured between opposite outer edges of the first center portion, each second solder ball pad includes a second center portion having a second diameter measured between opposite outer edges of the second center portion, and the first diameter is smaller than the second diameter.

21 Claims, 7 Drawing Sheets

(56) References Cited

U.S. PATENT DOCUMENTS

| | | | |
|---|---|---|---|
| 7,795,743 B2 | 9/2010 | Kim et al. | |
| 8,008,786 B2 | 8/2011 | Pham et al. | |
| 8,258,617 B2 | 9/2012 | Shibuya | |
| 8,304,867 B2 | 11/2012 | McCarthy et al. | |
| 8,487,438 B2 | 7/2013 | Lin et al. | |
| 8,581,418 B2 | 11/2013 | Wu et al. | |
| 8,598,691 B2 | 12/2013 | Wu et al. | |
| 8,835,301 B2 | 9/2014 | Choi et al. | |
| 9,087,832 B2 * | 7/2015 | Huang | H01L 23/49822 |
| 9,379,065 B2 | 6/2016 | Keser et al. | |
| 9,564,412 B2 * | 2/2017 | Aleksov | H01L 24/14 |
| 10,068,861 B2 | 9/2018 | Chuang | |
| 10,109,607 B2 | 10/2018 | Chen et al. | |
| 2004/0041393 A1 | 3/2004 | Lee | |
| 2015/0287685 A1 | 10/2015 | Sarihan et al. | |
| 2016/0064316 A1 | 3/2016 | Carpenter et al. | |

\* cited by examiner

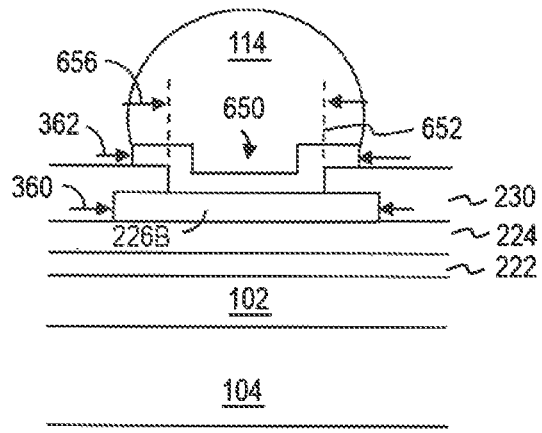
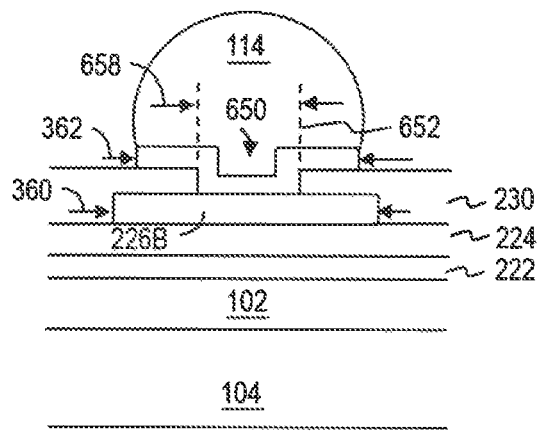
FIG. 6A     FIG. 6B
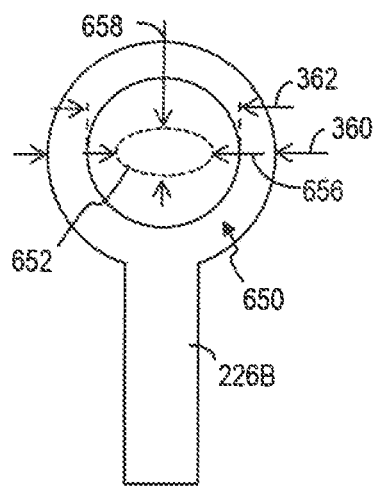
FIG. 6C

UNDERBUMP METALLIZATION DIMENSION VARIATION WITH IMPROVED RELIABILITY

BACKGROUND

Field

This disclosure relates generally to packaged devices, and more specifically, to improving the reliability of a packaged semiconductor device that includes solder connections.

Related Art

Packaged semiconductor devices include solder connections for forming external connections, such as to a printed circuit board. Due to various thermal and mechanical forces, solder connections can suffer various mechanical failures, which in turn reduce reliability and lifespan of the packaged semiconductor device.

BRIEF DESCRIPTION OF THE DRAWINGS

The present invention may be better understood, and its numerous objects, features, and advantages made apparent to those skilled in the art by referencing the accompanying drawings.

FIGS. 4A, 4B, 4C, 4D, 5A, 5B, 5C, 6A, 6B, and 6C are block diagrams depicting other example UBM structures on a packaged semiconductor device, according to some embodiments of the present disclosure.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1A:
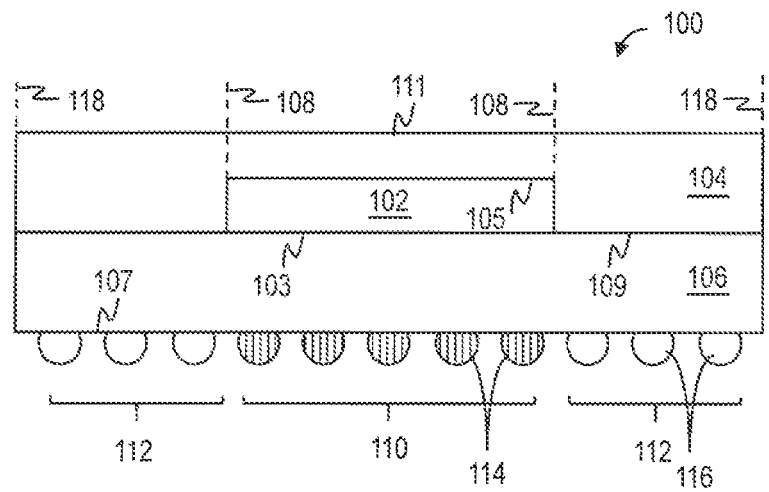
FIGS. 1A and 1B are block diagrams depicting an example packaged semiconductor device implementing solder connections formed on different underbump metallization (UBM) structures, according to some embodiments of the present disclosure.

The following sets forth a detailed description of various embodiments intended to be illustrative of the invention and should not be taken to be limiting.

Overview

Due to increasingly stringent reliability criteria expected of packaged semiconductor devices, it is generally desirable to increase the reliability and lifespan of solder connections used in such packages. The materials used in a package often have different coefficients of thermal expansion (CTE), which is a measurement that indicates a rate of expansion of a material as temperature of the ambient environment of the package changes. Often, as the ambient temperature changes, the difference in the amount of expansion and contraction between the different materials of a package introduces stress into the package, which can cause deformation and even damage to the package. Generally, stress is greater in an area of the package substrate that is laterally adjacent to the die or outside of a footprint of the die, as compared with stress in an area of the package substrate that is vertically adjacent to the die or under the die. The risk of damage may be greater in packages that implement redistributed layer (RDL) structures that are positioned close to a die in the package, where stresses from the RDL materials under the die may propagate the short distance to the active side of the die and cause damage to the underlying circuitry implemented in the active side of the die.

The present disclosure provides for improving reliability and lifespan of solder connections by implementing underbump metallization (UBM) structures that have varying dimensions matched to the stress experienced in different areas of a package. The package includes an embedded die and a package substrate on which a plurality of solder ball pads are implemented. The surface of the package substrate is divided into an area within a footprint of the die and an area outside of the footprint of the die. A first type of UBM structure is implemented in the area outside of the footprint, which has a center portion with a first lateral width. A second type of UBM structure is implemented in the area within the footprint, which has a center portion with a second lateral width that is smaller than the first lateral width. The wider center portion with the first lateral width provides a wider "seat" for a solder connection to reinforce the mechanical strength of the solder connection to better withstand the greater stresses that occur in the area outside of the die footprint and improve solder joint reliability. Since less stress occurs in the area within the die footprint, the UBM structures with the wider center portion are not needed, and may in fact introduce additional stress to the package substrate if implemented within the die footprint. Rather, the narrower center portion with the second lateral width provides a narrower profile to minimize the amount of expansion and contraction, which minimizes any additional stress that may be introduced into the package substrate by the UBM structures. In other embodiments, oblong shaped UBM structures may also be implemented within the die footprint, where the major axis of each oblong shaped UBM structure is perpendicular to a stress propagation direction originating near the center of the die footprint. Such oblong shaped UBM structures may include oblong shaped center portions, oblong shaped ring portions, or both.

EXAMPLE EMBODIMENTS

FIG. 1A shows a cross-sectional side view of an example packaged semiconductor device 100 (also referred to as device or package 100) that implements underbump metallization (UBM) structures. Package 100 includes a semiconductor die 102 (also referred to as die 102), a package body 104, and a package substrate 106, and a plurality of solder connections 114 and 116. It is noted that the device shown in the figures herein may be representative of a single device or a plurality of devices formed as part of an array or panel and then singulated into individual devices.

Semiconductor die 102 has a back side 105 of semiconductor material (e.g., bulk silicon) and an opposite front side or active side 103 that includes active circuitry and a plurality of pads (e.g., such as pads 220 shown in FIGS. 2A and 2B) connected to the active circuitry. Each of the plurality of pads are connected to a signal line of active circuitry that may carry input and output signals or power supply signals (e.g., Vss, Vdd) for the die 102. While the portion of the die 102 behind or underneath the active circuitry is referred to as bulk silicon, this portion (and the entire semiconductor die 102) can be any semiconductor material or combinations of materials, such as gallium arsenide, silicon germanium, silicon-on-insulator (SOI), silicon, monocrystalline silicon, the like, and combinations of the above. Die 102 has lateral edges that are perpendicular to the active and back sides 103 and 105, where the lateral edges of the die 102 form a perimeter or footprint 108, shown in dashed outline. The footprint 108 is visualized as extending in both vertical directions above and below the lateral edges of die 102.

As shown in FIG. 1A, the lateral edges and back side 105 of die 102 are surrounded by a package body 104, which may be formed from an encapsulant material such as mold compound based on a biphenyl type or multi-aromatic type epoxy resin, but may be other types of encapsulating materials in other embodiments. Package body 104 has a top surface 111 (shown near the top of FIG. 1A) that covers the back side 105 of die 102, forming a back side 111 of the package 100. In other embodiments, the back side 105 of die 102 may be exposed through the back side 111 of package body 104. Package body 104 also has lateral edges (which are perpendicular to back side 111) that form an outer perimeter 118, shown in dashed outline. The lateral edges of the package body 104 surround and are spaced apart from the lateral edges of the die 102, forming a bottom surface 109 of package body 104 that is coplanar with the active side 103 of die 102. Put another way, the active side 103 of die 102 is exposed through a bottom surface 109 of package body 104. The portion of package body 104 surrounding die 102 provides additional surface area on which package substrate 106 may be attached to or formed upon, as further discussed below. The die 102 may be embedded in package body 104 as an initial device structure. Multiple instances of these initial device structures may be formed as part of a panel or reconstituted wafer, which includes a plurality of die 102 embedded in encapsulant material and then singulated into the individual initial device structures.

Package substrate 106 is located on and directly contacts the active side 103 of die 102 and the bottom surface 109 of package body 104. In the embodiments discussed herein, package 100 is a fan out wafer level packaging (FOWLP) package structure, where package substrate 106 is formed or built on the initial device structure that includes the die 102 embedded in package body 104 using redistribution layer (RDL) technology. However, the underbump metallization (UBM) structure teachings of the present disclosure may also be applicable to other packaged devices that implement solder connections in areas inside and outside of a footprint of the die 102, such as packages that are formed on a separate or fully-formed package substrate 106 to which a die is then attached. For example, one such package substrate may be a ball grid array (BGA) substrate. In some embodiments, the initial device structure including the die 102 and package body 104 may together be attached to a fully-formed package substrate 106. In other embodiments, the die 102 may first be attached to a fully-formed package substrate 106, which may then be overmolded or otherwise encapsulated to form package body 104 around die 102.

In the embodiment shown in FIG. 1A, package substrate 106 is formed as a redistribution layer (RDL) structure (and thus may also be referred to as an RDL structure 106) over the active side 103 of die 102 and bottom surface 109 of package body 104. Package substrate 106 has an outer surface 107 (shown near the bottom of FIG. 1A) that forms a front side 107 of package 100. Front side 107 includes a plurality of solder connections 114 and 116, such as solder balls that are attached to solder ball pads formed on the front side 107 of package substrate 106. Solder connections 114 and 116 serve as external electrical connections for package 100, which electrically connect and mechanically attach package 100 to a carrier, such as a printed circuit board (PCB), a substrate, and the like. Conductive paths through the package substrate 106 electrically couple the plurality of pads on the die 102 to the solder connections 114 and 116, which are further discussed below in connection with FIGS. 2A and 2B.

Figure 1B:
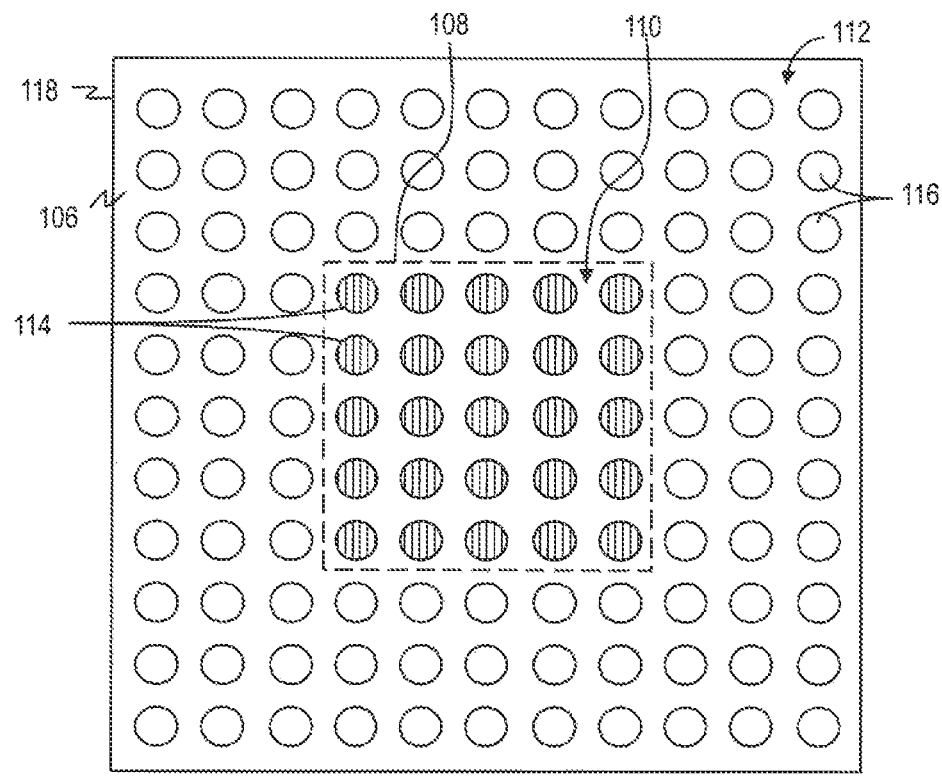

FIG. 1B shows a bottom-up planar view of package 100 in a face down orientation, which has the active side 103 of die 102 (and the front side 107 of package substrate 106) facing downward like that shown in FIG. 1A. FIG. 1B may also be characterized as a top-down view of package 100 in a face up orientation. FIG. 1B shows footprint 108 of die 102 in dashed outline near the center of package 100. In other embodiments, footprint 108 may be located elsewhere on package 100, depending on placement of the die 102, such as off-center and closer to one or more of the lateral edges 118 (e.g., along an edge or near a corner). Footprint 108 divides the front side 107 of package substrate 106 into an area 110 inside or within footprint 108 and an area 112 outside of footprint 108. Solder connections 114 (also identified with vertical hatching) are attached to solder ball pads located within area 110 or within footprint 108 (also referred to as located under the die 102), and solder connections 116 (without hatching) are attached to solder ball pads located within area 112 or outside of footprint 108 (also referred to as located outside of the die 102). In some embodiments, solder connections 114 and 116 have a same diameter, such as standard sized solder balls. For example, solder connections 114 and 116 may be implemented using solder balls having a diameter or width of 0.3 mm (or 300 microns), in some embodiments. Solder connections 114 and 116 may also implement a solder ball pitch of 0.5 mm (or 500 microns), in some embodiments. In order to reduces stress on the solder connections 114 and 116, the solder ball pads located within footprint 108 in area 110 under the die 102 are differently sized than solder ball pads located outside of footprint 108 in area 112 outside of the die 102, as further discussed below in connection with FIGS. 2A and 2B.

Figure 2A:
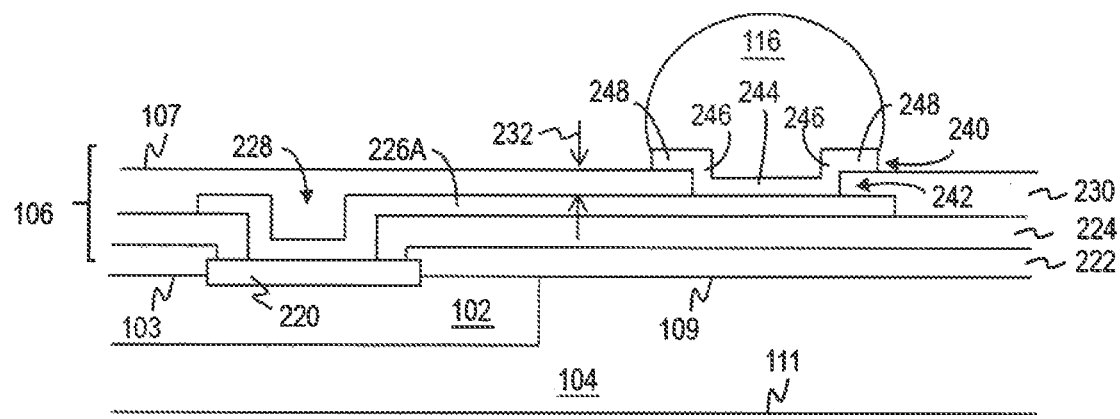
FIGS. 2A and 2B are block diagrams depicting UBM structures on a packaged semiconductor device, according to some embodiments of the present disclosure.
Figure 2B:
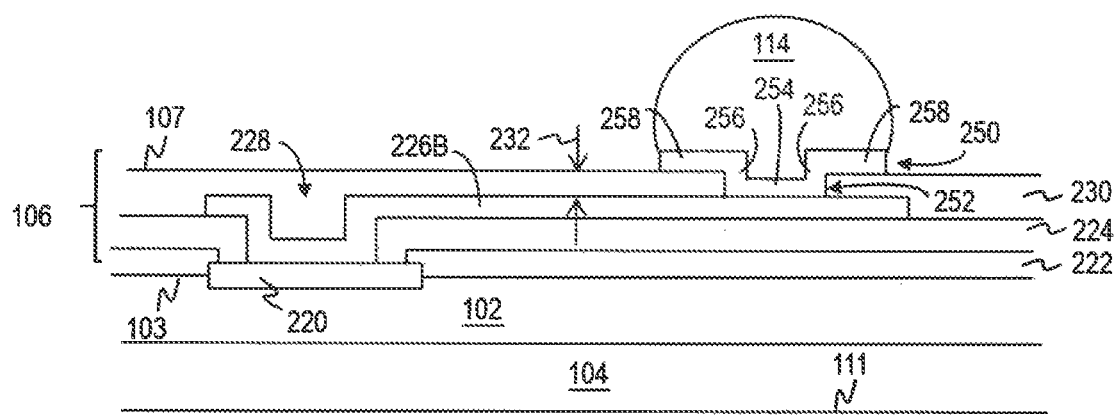

FIGS. 2A and 2B show a cross-sectional view of package 100 in a face up orientation, with active side 103 of die 102 facing upward. In some embodiments, the initial device structure that includes die 102 embedded in package body 104 may be positioned in a face-up orientation. In the example shown, a passivation layer 222 may be formed on the active side 103 of die 102 with a plurality of openings to expose each pad 220 on the active side 103. A plurality of patterned dielectric and metal layers are formed over active side 103 (including over passivation layer 222) and over surface 109 of package body 104 to form a redistributed layer (RDL) structure 106 as package substrate 106. The dielectric layers and metal layers form routing or conductive paths through the package substrate 106, including conductive paths from pads on die 102 (like pad 220) to a solder ball pad on the front side 107 of the package substrate 106. External connections are also attached to the solder ball pads. As noted above, the solder ball pads located inside (or within) the footprint 108 of the die 102 are differently sized than the solder ball pads located outside of the footprint 108 of the die 102, as further discussed below.

Examples of materials used for passivation layer 222 include but are not limited to silicon nitride, silicon dioxide, silicon oxynitride, polyimide, and other suitable dielectric materials. Examples of the materials used to form the dielectric layers in RDL structure 106 (including dielectric layer 230, discussed below) include but are not limited to polyimide, polybenzoxazole (PBO), benzocyclobutene (BCB), photo sensitive polyimide, and other suitable polymer dielectric materials. Conductive paths through RDL structure (or package substrate) 106 include structures (e.g., traces, pads, interconnects, vias) formed from an electrically conductive material, examples of which include but are not limited to nickel, gold, copper, aluminum, or other suitable conductive metal or alloy composed of one or more suitable conductive metals. The pads 220 on die 102 may also be coated with an electrically conductive material, examples of which include nickel, gold, copper, aluminum, tin, silver, titanium, or other suitable conductive metal or alloy composed of one or more suitable conductive metals in order to improve the "bondable" nature of the pad. Solder connections 114 and 116 may include tin or a tin alloy, and may take the shape of solder balls, solder bumps, or other suitable solder joints.

The RDL structure 106 may be formed using RDL or build up technology, such as by using a sequence of numerous process steps applied to the initial device structure that includes die 102 embedded in package body 106. Such process steps include but are not limited to depositing semiconductor materials including dielectric materials and metals, such as growing, oxidizing, sputtering, and conformal depositing, etching semiconductor materials, such as using a wet etchant or a dry etchant, performing photolithography for patterning, including depositing and removing photolithography masks or other photoresist materials, laminating, dispensing, printing, jetting, spraying, and the like. Further, a greater number of conductive layers, dielectric layers, or both may be implemented to create more complex routing structures and conductive paths through the package substrate 106 in other embodiments.

FIGS. 2A and 2B show cross-sectional views of example solder ball pads 240 and 250 on package 100. Solder ball pads 240 and 250 may be formed using one or more layers of one or more electrically conductive metals, such as a thin film stack, which is also referred to as an under bump metallization (UBM) stack. In some embodiments, solder ball pads 240 and 250 may be referred to as under bump metallization (UBM) structures 240 and 250. Examples of the materials used to form a thin film stack or UBM stack include but are not limited to nickel, gold, copper, aluminum, titanium, tungsten, chromium, palladium, or other suitable conductive metal or alloy composed of one or more suitable conductive metals. UBM structures 240 and 250 provide wettability and proper adhesion of solder connections 114 and 116.

FIG. 2A shows an example solder ball pad 240 that is located outside of the footprint 108 of the die 102, also referred to as being located outside of the die 102. An example conductive path is shown in metal layer 226 between pad 220 on the active side 103 of die 102 and solder ball pad 240 on front side 107 of package substrate 106. In some embodiments, a first dielectric layer 224 is deposited over the active side 103 (including over passivation layer 222), and each pad 220 on active side 130 is exposed through a respective opening 228 formed in dielectric layer 224. Metal layer 226 is deposited over the first dielectric layer 224, including within the openings 228. Metal layer 226 is patterned to form a plurality of first conductive paths like the one shown in FIG. 2A, which are referred to as first conductive paths 226A, each of which includes a via that makes direct (and electrical) contact with pad 220 within opening 228 at one end of the first conductive path, and a contact area for solder ball pad 240 located outside of footprint 108 (e.g., in area 112 outside footprint 108) at the other end of the first conductive path. While the example first conductive path 226A is shown as extending to the right in FIG. 2A, the first conductive path 226A may extend in any direction over footprint 108, as required by routing through package substrate 106.

Figure 3A:
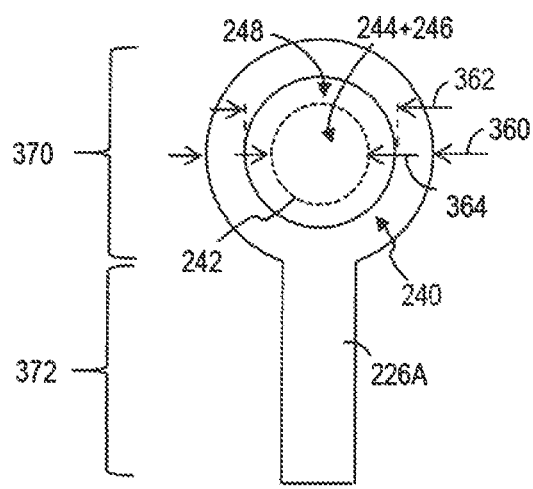
FIGS. 3A, 3B, 3C, and 3D are block diagrams depicting additional detail of UBM structures on a packaged semiconductor device, according to some embodiments of the present disclosure.

A second dielectric layer 230 is deposited over the patterned metal layer 226 including over the various first conductive paths 226A, and each contact area on the various first conductive paths 226A is exposed through a respective opening 242 formed in dielectric layer 230 (where contact area portion 370 of path 226A is further shown in FIG. 3A), where each opening 242 and the exposed contact area are located outside of footprint 108. A solder ball pad 240 is then formed within each opening 242. For example, in some embodiments, one or more metal layers may be formed over the second dielectric layer 230, including within openings 242, and patterned to form solder ball pads 240. In other embodiments, solder ball pads 240 (and solder ball pads 250, discussed below) may be formed using an electroless plating process to form a stack of metals within each opening 242 having edges that overlap the dielectric layer 230.

Each solder ball pad 240 includes a base portion 244 that makes direct (and electrical) contact with the contact area on the underlying first conductive path 226A that is exposed within opening 242, a sidewall portion 246 that extends up the sidewalls of opening 242, and an outer portion 248 that forms a ring around the perimeter of opening 242 on a top surface of the second dielectric layer 230 (which in the embodiment shown also forms the front side 107 of package substrate 106). In some embodiments, the base portion 244 and sidewall portion 246 together may be referred to as a center portion that is formed within opening 242. Solder connections 116 may then be attached through a reflow process to bond each solder connection 116 to a respective solder ball pad 240.

FIG. 2B shows an example solder ball pad 250 that is located within the footprint 108 of die 102, also referred to as being located under the die 102. Another example conductive path is shown in metal layer 226 between pad 220 on the active side 103 of die 102 and solder ball pad 250 on front side 107 of package substrate 106. As similarly discussed above, the first dielectric layer 224 is deposited over the active side 103 (including over passivation layer 222), and each pad 220 on active side 130 is exposed through a respective opening 228 formed in dielectric layer 224. Metal layer 226 is deposited over the first dielectric layer 224, including within the openings 228. Metal layer 226 is further patterned to also form a plurality of second conductive paths like the one shown in FIG. 2B, which are referred to as second conductive paths 226B, each of which includes a via that makes direct (and electrical) contact with pad 220 within opening 228 at one end of the second conductive path, and a contact area for solder ball pad 250 located within the footprint 108 (e.g., in area 110 within footprint 108) at the other end of the second conductive path. While the example second conductive path 226B is shown as extending a short distance to the right in FIG. 2A, the second conductive path 226B may extend in any direction within footprint 108 or may extend over footprint 108 and return to within footprint 108, as required by routing through package substrate 106.

The second dielectric layer 230 is deposited over the patterned metal layer 226, including over the various second conductive paths 226B, and each contact area on the various second conductive paths 226B is exposed through a respective opening 252 formed in dielectric layer 230 (where contact area 370 of path 226B is further shown in FIG. 3C), where each opening 252 and the exposed contact area are located within footprint 108. A solder ball pad 250 is then formed within each opening 252. For example, in some embodiments, the one or more metal layers formed over the second dielectric layer 230 may further be included within openings 252 and patterned to form solder ball pads 250. In other embodiments, solder ball pads 250 may be formed using the electroless plating process to form the stack of metals within each opening 252 having edges that overlap the dielectric layer 230.

Each solder ball pad 250 includes a base portion 254 that makes direct (and electrical) contact with the contact area on the underlying second conductive path 226B formed in metal layer 226 that is exposed within opening 252, a sidewall portion 256 that extends up the sidewalls of opening 252, and an outer portion 258 that forms a ring around the perimeter of opening 252 on the to surface of the second dielectric layer 230 (which in the embodiment shown also forms the front side 107 of package substrate 106). In some embodiments, the base portion 254 and sidewall portion 256 together may be referred to as a center portion that is formed within opening 252. Solder connections 114 may then be attached through a reflow process to bond each solder connection 114 to a respective solder ball pad 250.

It is noted that the height or thickness 232 of the dielectric layer 230 over (and directly contacting) the various first and second conductive paths 226A and 226B formed in metal layer 226 has the same value whether within footprint 108 or outside of footprint 108. This indicates that the sidewall height of opening 242 (formed outside of footprint 108) and the sidewall height of opening 252 (formed inside of footprint 108) in dielectric layer 230 have the same value, resulting in sidewall portions 246 and 256 of solder ball pads 240 and 250 having a same height. However, it is noted that the width or diameter of opening 252 in the dielectric layer 230 is smaller than the width or diameter of opening 242 in the dielectric layer 230. Generally, the stress experienced by solder connections 116 in the area 112 outside of the die 102 is greater as compared with the stress experienced by solder connections 114 within the area 110 under the die 102, due to different CTE (coefficient of thermal expansion) values of the die 102 (e.g., a small CTE inside footprint 108) and of the package body 104 laterally surrounding die 102 (e.g., a larger CTE outside of footprint 108), such as when the package 100 is attached to a carrier. Generally, materials with a larger CTE value expand and contract over temperature at a greater rate than materials with a smaller CTE value. Openings 242 with larger diameters are used to form solder ball pads 240 in the area 112 outside of the die 102 to create wider center portions (including portions 244 and 246) that may reinforce the mechanical strength of solder connection 116 to better withstand the stresses that occur within package 100 in the area 112 outside of the die 102, providing solder joint reliability of the solder connections 116.

However, if such large diameter openings were also implemented in the area 110 under the die 102, the wider center portions formed within such large diameter openings would introduce additional stress into the package substrate 106 due to the different CTE values of the wide (metal) center portion (e.g., a small CTE) and the package substrate 106 that includes dielectric layers (e.g., a larger CTE). Since the package substrate 106 is located closely to the active side 103 of die 102 within area 110, such additional stress may not only cause damage to the package substrate 106, but may also propagate through package substrate 106 and cause damage to the active side 103 of die 102, especially if the package substrate 106 is implemented as an RDL structure 106. To minimize such stress, the diameter of openings 252 is reduced in order to reduce the diameter of the center portions of the resulting solder ball pads 250 in the area 110 under the die 102. By reducing the diameter of openings 252, the amount of expansion and contraction of the resulting center portion of solder ball pad 250 is reduced. Since such expansion and contraction occurs within dielectric layer 230, reducing the diameter of openings 252 also minimizes the possibility of damage to the package substrate 106 and the underlying die 102. In this manner, differently sized openings 242 and 252 are implemented to achieve different diameters of the center portions of solder ball pads 240 and 250, which accommodate the different stresses experienced by the solder connections inside and outside of footprint 108.

Figure 3C:
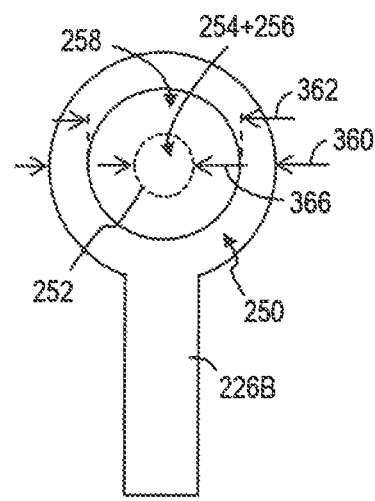

FIG. 3A shows a top-down view of first conductive path 226A that underlies solder ball pad (or UBM structure) 240 and FIG. 3C shows a top-down view of second conductive path 226B that underlies solder ball pad (or UBM structure) 250. Dielectric layers are omitted in FIGS. 3A and 3C to clearly show the solder ball pads and their respective underlying conductive paths.

Figure 3B:
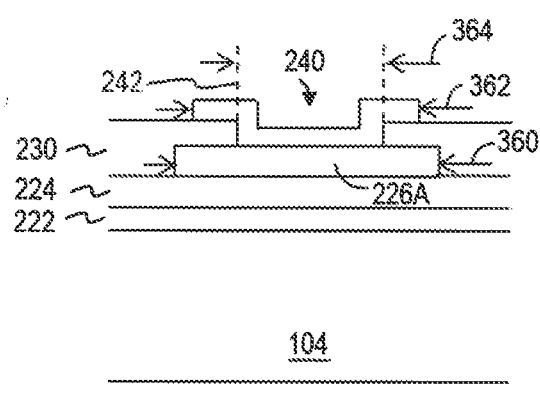
Figure 3D:
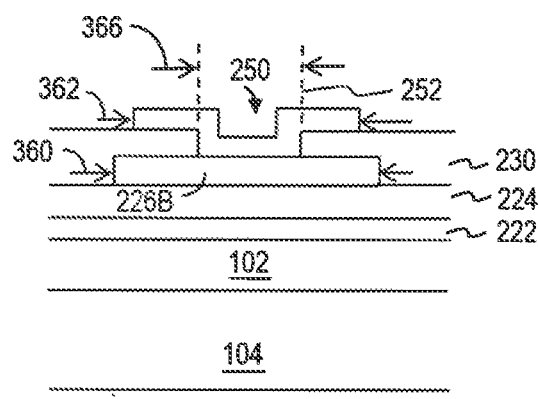

FIGS. 3B and 3D show cross-sectional views of the respective solder ball pads 240 and 250 and their underlying conductive paths 226A and 226B. It is noted that FIGS. 2A and 2B show lateral side views of respective solder ball pads 240 and 250 and their respective conductive path, while FIGS. 3B and 3D show perpendicular head-on views across respective solder ball pads 240 and 250 and their respective conductive path, such as across a plane indicated by arrows 360 in FIGS. 3A and 3C.

Conductive paths 226A and 226B each have a contact area portion 370 that provides a contact area for the respective solder ball pad, a trace portion 372 that extends to a pad 220 on die 102, and a via portion that makes direct contact with pad 220 within opening 228 like that shown in FIGS. 2A and 2B. Solder ball pad 240 includes a center portion labeled 244+246, which includes base and sidewall portions 244 and 246 formed within opening 242, where a perimeter of opening 242 is shown in dashed outline in FIGS. 3A and 3B. Solder ball pad 250 includes a center portion labeled 254+256, which includes base and sidewall portions 254+ 256 formed within opening 252, where a perimeter of opening 252 is shown in dashed outline. Solder ball pad 240 also includes a ring portion 248 outside of opening 242, and solder ball pad 250 also includes a ring portion 258 outside of opening 252.

Contact area portions 370 of both conductive paths 226A and 226B have a same width or diameter 360. Both the outer edge of ring portion 248 and the outer edge of ring portion 258 have a same width or diameter 362, where diameter 360 of the underlying contact area portions 370 is larger than the diameter 362 of the outer edges of ring portions 248 and 258. Diameter 362 may also be referred to as an outer diameter 362 of solder ball pads 240 and 250, where an attachment area of solder ball pads 240 and 250 may be given as the area within a circle having diameter 362. The center portion 244+246 is formed within opening 242 and has a diameter 364 (e.g., measured between opposite side walls of the center portion 244+246). The center portion 254+256 is formed within opening 252 and has a diameter 366 (e.g., measured between opposite side walls of the center portion 254+256). Diameter 364 may also be referred to as an inner diameter 364 of solder ball pad 240, and diameter 366 may be referred to as inner diameter 366 of solder ball pad 250. Inner diameter 366 of solder ball pad 250 is smaller than inner diameter 364 of solder ball pad 240. For example, inner diameter 364 may be 240 microns and inner diameter 366 may be 200 microns, in some embodiments. By having the same outer diameter 362 (and a same sized attachment area), both solder ball pads 240 and 250 are configured for attachment of uniformly sized (or standard sized) solder connections across the package substrate 106, while also providing differently sized inner diameters 364 and 366 to accommodate the different stress experienced by the solder connections inside and outside of footprint 108.

Figure 4A:
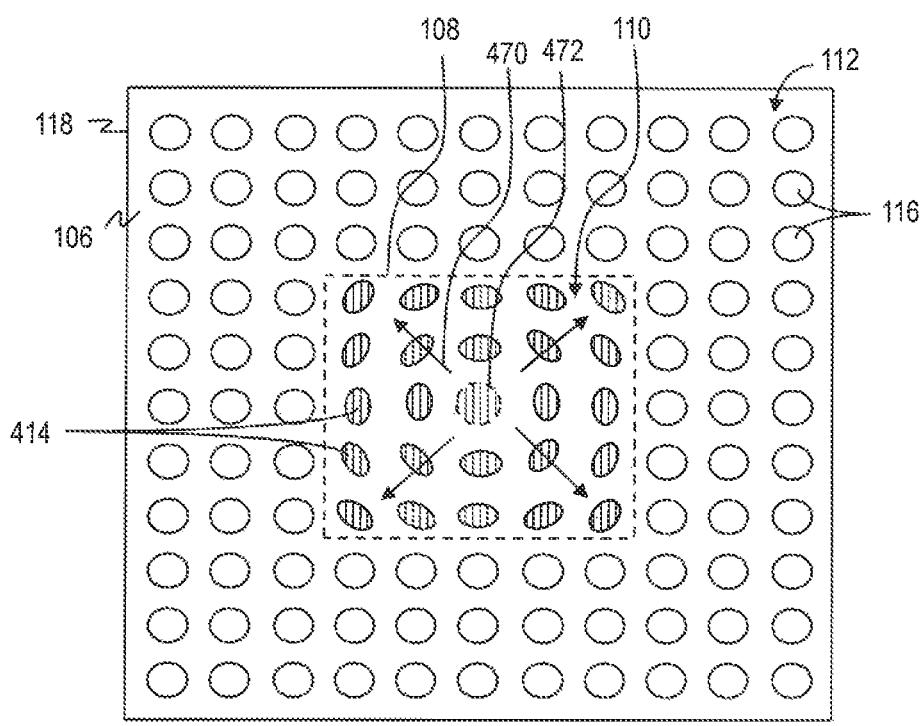

FIG. 4A shows a bottom-up planar view of another embodiment of package 100 that implements differently shaped solder ball pads (or UBM structures) 450 within footprint 108. It is noted that each shape of solder connections 116 and 414 implemented on package substrate 106 in FIG. 4A mimics the shape of the underlying solder ball pad. For example, a plurality of solder ball pads 240 are implemented on package substrate 106 in area 112 outside of footprint 108, where each solder ball pad 240 has a round or circular shape, or has a same outer diameter 362 in both x- and y-directions of the planar view of FIG. 4A. Each solder connection 116 that wets or attaches to a solder ball pad 240 also has the round or circular shape.

Differently shaped solder ball pads (or UBM structures) are implemented on package substrate 106 in area 110 within footprint 108, based on stress propagation. Generally, stress is propagated through the package substrate 106 radially outward from a center point within the footprint 108 toward the footprint 108, where radial stress propagation direction 470 is represented as arrows pointing outward from a generally stress neutral point centered within footprint 108 and increases with distance away from the center point (e.g., greater stress around the edges of die 102, greatest stress around the edges of package substrate 106). Depending on the number of solder connections needed and the layout of solder connections implemented (e.g., in regular rows or in an irregular pattern) within the footprint 108, a solder connection 472 attached to a solder ball pad 250 may optionally be implemented near the center point, as indicated by dashed outline in FIG. 4A. In embodiments that include solder connection 472 and solder ball pad 250, the round shape of solder ball pad 250 also causes the solder connection 472 to have the round shape, as shown in FIG. 4A. In other embodiments, a solder connection and solder ball pad may be omitted near the center point.

Figure 4B:
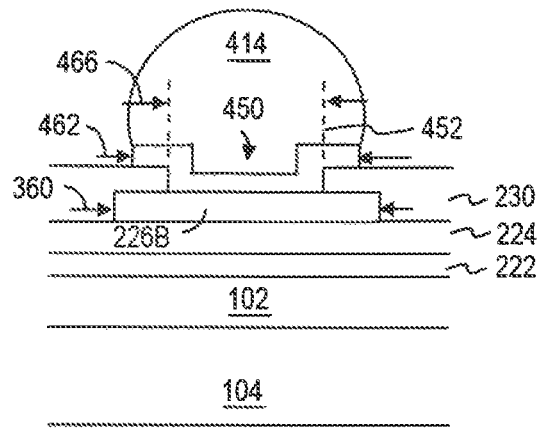
Figure 4C:
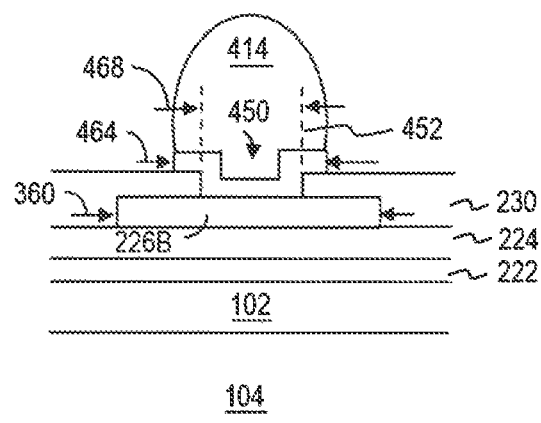
Figure 4D:
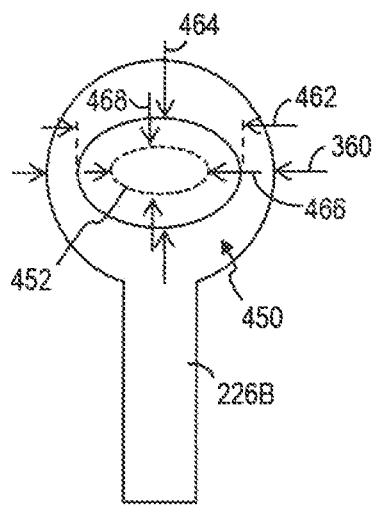

In one embodiment, the remaining solder ball pads within footprint 108 (and surrounding optional solder connection 472 and solder ball pad 250) are implemented as solder connections 414 and solder ball pads 450 and having an oblong shape, as shown in cross-sectional detail in FIGS. 4B and 4C and in top-down detail in FIG. 4D. FIG. 4B shows a lateral cross-sectional view along the major axis of solder ball pad 450, and FIG. 4C shows a perpendicular cross-sectional view along the minor axis of solder ball pad 450. FIG. 4D omits the dielectric layers, for clarity's sake. FIGS. 4B, 4C, and 4D show ring portion of solder ball pad 450 having a long diameter 462 in the direction of the major axis (e.g., in the x-direction), and a short diameter 464 in the direction of the minor axis (e.g., in the y-direction), resulting in the ring portion having an oblong or oval shaped outer perimeter. The attachment area of solder ball pad 450 may be determined as the area of an oval having a major axis diameter 462 and minor axis diameter 464. In some embodiments, the attachment area of solder ball pad 450 is substantially equivalent to the attachment area of solder ball pads 240, although differently shaped. Each solder ball pad 450 is positioned within the footprint 108 such that the long diameter 462 of solder ball pad 450 is perpendicular to stress propagation direction 470.

Each solder ball pad 450 is formed within an oblong shaped opening 452 in dielectric layer 230, having a perimeter indicated by dashed outline. Opening 452 has a long diameter 466 in the direction of the major axis (shown in FIG. 4B), and a short diameter 468 in the direction of the minor axis (shown in FIG. 4C), where the opening 452 is oriented such that the long diameter 466 is also perpendicular to stress propagation direction 470. As a result, the center portion of solder ball pad 450 also has an oblong shape centered within the oblong ring portion of solder ball pad 450. By positioning the short diameters 464 and 468 parallel to the stress propagation direction 470, the diameter of the center portion of solder ball pad 450 is effectively minimized, which minimizes any stress introduced into the package substrate 106. Further, by having the same sized (although differently shaped) attachment area, both solder ball pads 240 and 450 are configured for attachment of uniformly sized (or standard sized) solder connections, while also providing differently sized and shaped inner diameters 364 and 466+468 to accommodate the different stress experienced by the solder connections inside and outside of footprint 108.

Figure 5A:
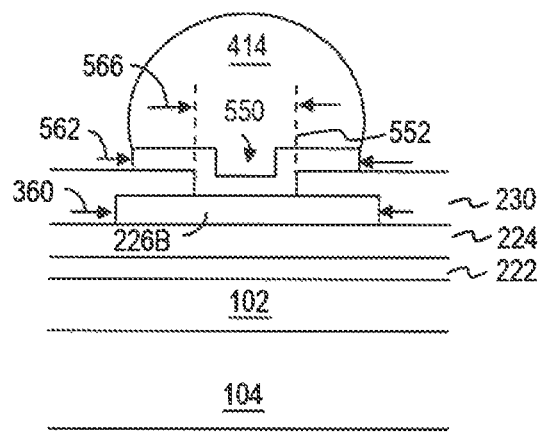
Figure 5B:
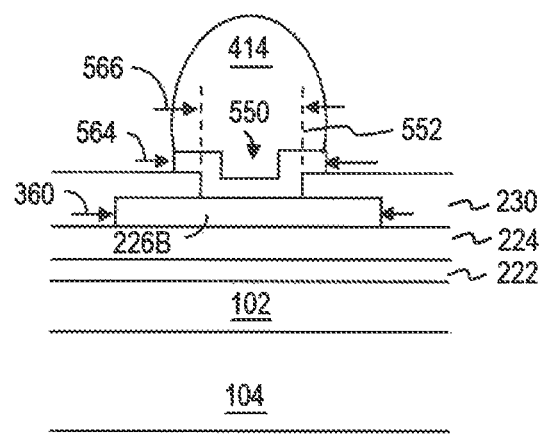
Figure 5C:
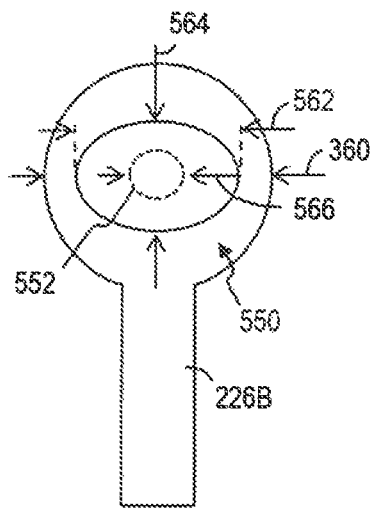

Another embodiment of solder ball pad 550 implemented within footprint 108 is shown in FIGS. 5A, 5B, and 5C, where a round or circular shaped opening 552 is formed in the dielectric layer 230 to create a circular shaped center portion of solder ball pad 550 within an oblong shaped ring portion. FIGS. 5A and 5B show cross-sectional detail, and FIG. 5C show top-down detail, of solder ball pad 550. FIG. 5C shows ring portion of solder ball pad 550 has a long diameter 562 in the direction of the major axis (shown in the x-direction), and a short diameter 564 in the direction of the minor axis (shown in the y-direction), where the ring portion is oriented such that the long diameter 562 is perpendicular to stress propagation direction 470 (as shown in FIG. 4A). Opening 552 has a same diameter 566 in both x- and y-directions of the plane shown in FIG. 5C. The resulting circular shaped center portion is centered within the oblong shaped ring portion of solder ball pad 550. In some embodiments, the resulting solder ball pad 550 would similarly have a same sized (although differently shaped) attachment area as solder ball pads 240 implemented outside of footprint 108, where both types of pads are configured for attachment of uniformly sized (or standard sized) solder connections. Thus, pads 550 and 240 respectively provide differently sized inner openings 242 and 566 to accommodate the different stress experienced by the solder connections inside and outside of footprint 108.

Another embodiment of solder ball pad 650 implemented within footprint 108 is shown in FIGS. 6A, 6B, and 6C, where an oblong opening 652 is formed in the dielectric layer 230 to create an oblong center portion of solder ball pad 650 within a circular shaped ring portion. FIGS. 6A and 6B show cross-sectional detail, and FIG. 6C shows top-down detail, of solder ball pad 650. FIG. 6C shows ring portion of solder ball pad 650 has a same outer diameter 362 in both x- and y-directions of the plane. FIG. 6C also shows opening 652 has a long diameter 656 in the direction of the major axis (shown in the x-direction), and a short diameter 658 in the direction of the minor axis (shown in the y-direction), where the opening 652 is oriented such that the long diameter 656 is perpendicular to stress propagation direction 470 (as shown in FIG. 4A). Thus, the opening 652 within solder ball pad 650 may be oriented with respect to the stress propagation direction 470, such as by rotating the position of opening 652 within the solder ball pad's outer diameter 362, without affecting the routing design of the underlying conductive path. In some embodiments, the resulting solder ball pad 650 would similarly have a same sized (although differently shaped) attachment area as solder ball pads 240 that are implemented outside of footprint 108, where both types of pads are configured for attachment of uniformly sized (or standard sized) solder connections 114. Thus, pads 650 and 240 respectively provide differently sized inner openings 242 and 652 to accommodate the different stress experienced by the solder connections 114 inside and outside of footprint 108.

By now it should be appreciated that there has been provided UBM structures that implement differently shaped or differently sized center portions in a package to accommodate the different stresses experienced by solder connections inside and outside of a die footprint.

In one embodiment of the present disclosure, a packaged semiconductor device is provided, which includes: a semiconductor die embedded in mold compound, the semiconductor die having an active side exposed through the mold compound; and a redistributed layer (RDL) structure formed over the active side of the semiconductor die, the RDL structure including a plurality of solder ball pads on an outermost side of the RDL structure, the outermost side of the RDL structure forming a front side of the packaged semiconductor device, wherein the plurality of solder ball pads includes: a set of first solder ball pads located on the front side of the packaged semiconductor device within a footprint of the semiconductor die, and a set of second solder ball pads located on the front side of the packaged semiconductor device outside of the footprint of the semiconductor die, each first solder ball pad includes a first center portion, wherein a first diameter is measured across the first solder ball pad between opposite outer edges of the first center portion, each second solder ball pad includes a second center portion, wherein a second diameter is measured across the second solder ball pad between opposite outer edges of the second center portion, and the first diameter is smaller than the second diameter.

One aspect of the above embodiment provides that the packaged semiconductor device further includes: a plurality of solder connections attached to the sets of first and second solder ball pads, wherein a uniformly sized solder connection is attached to each of the first and second solder ball pads.

Another aspect of the above embodiment provides that each first center portion of each first solder ball pad includes: a first planar portion, and a first sidewall portion extending perpendicularly around an outer edge of the first planar portion, and each second center portion of each second solder ball pad includes: a second planar portion, and a second sidewall portion extending perpendicularly around an outer edge of the second planar portion.

A further aspect of the above embodiment provides that the first diameter is measured across the first solder ball pad between opposite outer edges of the first sidewall portion, and the second diameter is measured across the second solder ball pad between opposite outer edges of the second sidewall portion.

Another aspect of the above embodiment provides that each first center portion of each first solder ball pad is formed on a respective conductive layer portion of the RDL structure within a respective first opening in a dielectric layer over the respective conductive layer portion, wherein sidewalls of the respective first opening define the outer edges of the first center portion of the first solder ball pad, and each second center portion of each second solder ball pad is formed on a respective conductive layer portion of the RDL structure within a respective second opening in the dielectric layer over the respective conductive layer portion, wherein sidewalls of the respective second opening define the outer edges of the second center portion of the second solder ball pad.

A further aspect of the above embodiment provides that a thickness of the dielectric layer over the respective conductive layer portion defines a height of the first and second center portions of the first and second solder ball pads.

Another aspect of the above embodiment provides that each first solder ball pad further includes a first ring portion that extends laterally outward from the first center portion over a dielectric layer of the RDL structure, and each second solder ball pad further includes a second ring portion that extends laterally outward from the second center portion over the dielectric layer of the RDL structure.

A further aspect of the above embodiment provides that a first lateral diameter is measured across the first solder ball pad between opposite outer edges of the first ring portion, a second lateral diameter is measured across the second solder ball pad between opposite outer edges of the second ring portion, and the first lateral diameter is equal to the second lateral diameter.

Another further aspect of the above embodiment provides that one or fewer first solder ball pad that is located at a center point of the footprint of semiconductor die has a circular shaped first ring portion over the dielectric layer of the RDL structure, all remaining first solder ball pads within the footprint have at least one of: an oblong shaped first ring portion over the dielectric layer, and an oblong shaped first center portion, wherein each oblong shaped first ring portion has a first lateral width in a first direction and a second lateral width in a second direction perpendicular to the first direction, the first lateral width is longer than the second lateral width, each oblong shaped first center portion has a third lateral width in the first direction and a fourth lateral width in the second direction perpendicular to the first direction, and the third lateral width is longer than the fourth lateral width.

A still further aspect of the above embodiment provides that all remaining first solder ball pads that have the oblong shaped first ring portion or oblong shaped center portion are oriented around the center point such that the first lateral width or third lateral width is perpendicular to a stress propagation direction, wherein the stress propagation direction is directed radially outward from the center point.

In another embodiment of the present disclosure, a packaged semiconductor device is provided, which includes: a package substrate having a first major side and an opposite second major side, wherein the first major side is configured for connection to a semiconductor die within a die attachment area, a footprint area on the second major side corresponds to a footprint of the die attachment area, the second major side includes a set of first underbump metallization (UBM) structures located within the footprint area and a set of second UBM structures located outside of the footprint area, each of the first UBM structures is formed within a first opening in a top dielectric layer on the second major side of the package substrate, the first opening having a first diameter, each of the second UBM structures is formed within a second opening in the top dielectric layer on the second major side of the package substrate, the second opening having a second diameter, the first diameter is smaller than the second diameter.

One aspect of the above embodiment provides that the packaged semiconductor device further includes: a plurality of solder connections attached to the sets of first and second UBM structures, wherein a uniformly sized solder connection is attached to each of the first and second UBM structures.

Another aspect of the above embodiment provides that the top dielectric layer covers a plurality of conductive layer portions of the packaged substrate, each first opening and each second opening in the top dielectric layer exposes a surface of a respective conductive layer portion, each first UBM structure and each second UBM structure is formed on a respective exposed surface of the respective conductive layer portion.

Another aspect of the above embodiment provides that each first UBM structure includes a first ring portion that extends outward from the first opening over a top surface of the top dielectric layer, each second UBM structure includes a second ring portion that extends outward from the second opening over the top surface of the top dielectric layer.

A further aspect of the above embodiment provides that one or fewer first UBM structure that is located at a center point of the footprint of the semiconductor die has a circular shaped first ring portion over the top dielectric layer, all remaining first UBM structures within the footprint have an oblong shaped first ring portion over the top dielectric layer, each oblong shaped first ring portion having a first lateral width in a first direction and a second lateral width in a second direction perpendicular to the first direction, and the first lateral width is longer than the second lateral width.

A still further aspect of the above embodiment provides that the first opening has the first diameter in the first direction and further has a perpendicular diameter in the second direction, the first diameter is longer than the perpendicular diameter, and the first opening is centered within the oblong shaped first ring portion.

Another still further aspect of the above embodiment provides that the first opening has the first diameter in both the first and second directions, and the first opening is centered within the oblong shaped first ring portion.

Another still further aspect of the above embodiment provides that all remaining first UBM structures that have the oblong shaped first ring portion are oriented around the center point such that the first lateral width is perpendicular to a stress propagation direction, wherein the stress propagation direction is directed radially outward from the center point.

Another further aspect of the above embodiment provides that one or fewer first UBM structure that is located at a center point of the footprint of the semiconductor die has a circular shaped first ring portion over the top dielectric layer, all remaining first UBM structures within the footprint have a circular shaped first ring portion over the top dielectric layer, each circular shaped first ring portion having a first lateral width in both a first direction and in a second direction perpendicular to the first direction, the first opening has the first diameter in the first direction and further has a perpendicular diameter in the second direction, the first diameter is longer than the perpendicular diameter, and the first opening is centered within the circular shaped first ring portion.

A still further aspect of the above embodiment provides all remaining first UBM structures that have the oblong shaped first opening are oriented around the center point such that the first diameter is perpendicular to a stress propagation direction, wherein the stress propagation direction is directed radially outward from the center point.

Another aspect of the above embodiment provides that the package substrate is formed as a redistributed layer (RDL) structure over an active side of a semiconductor die, wherein the first major side of the package substrate contacts the semiconductor die.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

The following description refers to nodes or features being "connected" or "coupled" together. As used herein, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node of feature. For example, a switch may be "coupled to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value.

Although the invention is described herein with reference to specific embodiments, various modifications and changes can be made without departing from the scope of the present invention as set forth in the claims below. For example, a larger or smaller die 102 with a larger or smaller footprint 108 that encompasses a larger or smaller number of electrical connections may be implemented in FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:
a semiconductor die embedded in mold compound, the semiconductor die having an active side exposed through the mold compound; and
a redistributed layer (RDL) structure formed over the active side of the semiconductor die, the RDL structure comprising a plurality of solder ball pads on an outermost side of the RDL structure, the outermost side of the RDL structure forming a front side of the packaged semiconductor device, wherein
the plurality of solder ball pads comprise:
a set of first solder ball pads located on the front side of the packaged semiconductor device within a footprint of the semiconductor die, and
a set of second solder ball pads located on the front side of the packaged semiconductor device outside of the footprint of the semiconductor die,
each first solder ball pad comprises a first center portion, wherein a first diameter is measured across the first solder ball pad between opposite outer edges of the first center portion,
each second solder ball pad comprises a second center portion, wherein a second diameter is measured across the second solder ball pad between opposite outer edges of the second center portion, and
the first diameter is smaller than the second diameter.

2. The packaged semiconductor device of claim 1, further comprising:
a plurality of solder connections attached to the sets of first and second solder ball pads, wherein a uniformly sized solder connection is attached to each of the first and second solder ball pads.

3. The packaged semiconductor device of claim 1, wherein
each first center portion of each first solder ball pad comprises:
a first planar portion, and
a first sidewall portion extending perpendicularly around an outer edge of the first planar portion, and
each second center portion of each second solder ball pad comprises:
a second planar portion, and
a second sidewall portion extending perpendicularly around an outer edge of the second planar portion.

4. The packaged semiconductor device of claim 3, wherein
the first diameter is measured across the first solder ball pad between opposite outer edges of the first sidewall portion, and
the second diameter is measured across the second solder ball pad between opposite outer edges of the second sidewall portion.

5. The packaged semiconductor device of claim 1, wherein
each first center portion of each first solder ball pad is formed on a respective conductive layer portion of the RDL structure within a respective first opening in a dielectric layer over the respective conductive layer portion, wherein sidewalls of the respective first opening define the outer edges of the first center portion of the first solder ball pad, and
each second center portion of each second solder ball pad is formed on a respective conductive layer portion of the RDL structure within a respective second opening in the dielectric layer over the respective conductive layer portion, wherein sidewalls of the respective second opening define the outer edges of the second center portion of the second solder ball pad.

6. The packaged semiconductor device of claim 5, wherein
a thickness of the dielectric layer over the respective conductive layer portion defines a height of the first and second center portions of the first and second solder ball pads.

7. The packaged semiconductor device of claim 1, wherein
each first solder ball pad further comprises a first ring portion that extends laterally outward from the first center portion over a dielectric layer of the RDL structure, and
each second solder ball pad further comprises a second ring portion that extends laterally outward from the second center portion over the dielectric layer of the RDL structure.

8. The packaged semiconductor device of claim 7, wherein
a first lateral diameter is measured across the first solder ball pad between opposite outer edges of the first ring portion,
a second lateral diameter is measured across the second solder ball pad between opposite outer edges of the second ring portion, and
the first lateral diameter is equal to the second lateral diameter.

9. The packaged semiconductor device of claim 7, wherein
one or fewer first solder ball pad that is located at a center point of the footprint of semiconductor die has a circular shaped first ring portion over the dielectric layer of the RDL structure,
all remaining first solder ball pads within the footprint have at least one of:
an oblong shaped first ring portion over the dielectric layer, and
an oblong shaped first center portion, wherein
each oblong shaped first ring portion has a first lateral width in a first direction and a second lateral width in a second direction perpendicular to the first direction,
the first lateral width is longer than the second lateral width,
each oblong shaped first center portion has a third lateral width in the first direction and a fourth lateral width in the second direction perpendicular to the first direction, and
the third lateral width is longer than the fourth lateral width.

10. The packaged semiconductor device of claim 9, wherein all remaining first solder ball pads that have the oblong shaped first ring portion or oblong shaped center portion are oriented around the center point such that the first lateral width or third lateral width is perpendicular to a stress propagation direction, wherein the stress propagation direction is directed radially outward from the center point.

11. A packaged semiconductor device comprising:
a package substrate having a first major side and an opposite second major side, wherein
the first major side is configured for connection to a semiconductor die within a die attachment area,
a footprint area on the second major side corresponds to a footprint of the die attachment area,
the second major side includes a set of first underbump metallization (UBM) structures located within the footprint area and a set of second UBM structures located outside of the footprint area,
each of the first UBM structures is formed within a first opening in a top dielectric layer on the second major side of the package substrate, the first opening having a first diameter,
each of the second UBM structures is formed within a second opening in the top dielectric layer on the second major side of the package substrate, the second opening having a second diameter,
the first diameter is smaller than the second diameter.

12. The packaged semiconductor device of claim 11, further comprising:
a plurality of solder connections attached to the sets of first and second UBM structures, wherein a uniformly sized solder connection is attached to each of the first and second UBM structures.

13. The packaged semiconductor device of claim 11, wherein
the top dielectric layer covers a plurality of conductive layer portions of the packaged substrate,
each first opening and each second opening in the top dielectric layer exposes a surface of a respective conductive layer portion,
each first UBM structure and each second UBM structure is formed on a respective exposed surface of the respective conductive layer portion.

14. The packaged semiconductor device of claim 11, wherein
each first UBM structure comprises a first ring portion that extends outward from the first opening over a top surface of the top dielectric layer,
each second UBM structure comprises a second ring portion that extends outward from the second opening over the top surface of the top dielectric layer.

15. The packaged semiconductor device of claim 14, wherein
one or fewer first UBM structure that is located at a center point of the footprint of the semiconductor die has a circular shaped first ring portion over the top dielectric layer,
all remaining first UBM structures within the footprint have an oblong shaped first ring portion over the top dielectric layer, each oblong shaped first ring portion having a first lateral width in a first direction and a second lateral width in a second direction perpendicular to the first direction, and
the first lateral width is longer than the second lateral width.

16. The packaged semiconductor device of claim 15, wherein
the first opening has the first diameter in the first direction and further has a perpendicular diameter in the second direction,
the first diameter is longer than the perpendicular diameter, and
the first opening is centered within the oblong shaped first ring portion.

17. The packaged semiconductor device of claim 15, wherein
the first opening has the first diameter in both the first and second directions, and
the first opening is centered within the oblong shaped first ring portion.

18. The packaged semiconductor device of claim 15, wherein
all remaining first UBM structures that have the oblong shaped first ring portion are oriented around the center point such that the first lateral width is perpendicular to a stress propagation direction, wherein the stress propagation direction is directed radially outward from the center point.

19. The packaged semiconductor device of claim 14, wherein
one or fewer first UBM structure that is located at a center point of the footprint of the semiconductor die has a circular shaped first ring portion over the top dielectric layer,
all remaining first UBM structures within the footprint have a circular shaped first ring portion over the top dielectric layer, each circular shaped first ring portion having a first lateral width in both a first direction and in a second direction perpendicular to the first direction,
the first opening has the first diameter in the first direction and further has a perpendicular diameter in the second direction,
the first diameter is longer than the perpendicular diameter, and
the first opening is centered within the circular shaped first ring portion.

20. The packaged semiconductor device of claim 19, wherein
all remaining first UBM structures that have the oblong shaped first opening are oriented around the center point such that the first diameter is perpendicular to a stress propagation direction, wherein the stress propagation direction is directed radially outward from the center point.

21. The packaged semiconductor device of claim 11, wherein
the package substrate is formed as a redistributed layer (RDL) structure over an active side of a semiconductor die, wherein the first major side of the package substrate contacts the semiconductor die.

* * * * *